United States Patent
Yamada

(10) Patent No.: US 9,691,320 B2
(45) Date of Patent: Jun. 27, 2017

(54) DISPLAY APPARATUS WITH COLOR FILTERS AND LIGHT SOURCES AND METHOD OF CONTROLLING THE SAME

(71) Applicant: NICHIA CORPORATION, Anan-shi, Tokushima (JP)

(72) Inventor: Motokazu Yamada, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 205 days.

(21) Appl. No.: 13/832,607

(22) Filed: Mar. 15, 2013

(65) Prior Publication Data

US 2013/0257920 A1     Oct. 3, 2013

(30) Foreign Application Priority Data

Mar. 29, 2012  (JP) .................... 2012-075357

(51) Int. Cl.
*G09G 5/00*     (2006.01)
*G09G 3/22*     (2006.01)
(Continued)

(52) U.S. Cl.
CPC ............ *G09G 3/22* (2013.01); *G09G 3/3413* (2013.01); *H01L 25/0753* (2013.01);
(Continued)

(58) Field of Classification Search
CPC ............ G09G 3/3413; G09G 3/2025; G09G 2310/0235; G02F 2001/13614; G02F 2001/13622
(Continued)

(56) References Cited

U.S. PATENT DOCUMENTS 7,358,954 B2 *  4/2008  Negley ................ G09G 3/3413
                                                        345/102
7,564,180 B2 *  7/2009  Brandes ............... C09K 11/586
                                                         257/89
(Continued)

FOREIGN PATENT DOCUMENTS

EP          2163594         3/2010
JP       2009-229974       10/2009
(Continued)

OTHER PUBLICATIONS

J. K. Sheu et al., "White-Light Emission From Near UV InGaN—GaN LED Chip Precoated With Blue/Green/Red Phosphors", IEEE Photonics Technology Letters, Jan. 1, 2003, pp. 18-20, vol. 15, No. 1.

(Continued)

*Primary Examiner* — Chanh Nguyen
*Assistant Examiner* — Yuzhen Shen
(74) *Attorney, Agent, or Firm* — Mori & Ward, LLP

(57) ABSTRACT

A display apparatus includes a first light source, a second light source, a third light source, a first color filter, a second color filter, a third color filter, and an opto-functional device. The first light source and the second light source are allowed to emit light in a first emission time period to form a first display pattern. The third light source is allowed to emit light and the opto-functional device controls the third color filter to transmit light in a second emission time period to form a second display pattern. The first emission time period and the second emission time period are alternately repeated to combine the first display pattern and the second display pattern to obtain an intended display pattern when the display apparatus displays the intended display pattern.

16 Claims, 9 Drawing Sheets

(51) Int. Cl.
  *G09G 3/34* (2006.01)
  *H01L 25/075* (2006.01)
  *G09G 3/20* (2006.01)
  *H01L 33/50* (2010.01)

(52) U.S. Cl.
  CPC ... *G09G 3/2025* (2013.01); *G09G 2310/0235* (2013.01); *G09G 2310/0237* (2013.01); *G09G 2320/0242* (2013.01); *H01L 33/50* (2013.01); *H01L 2924/0002* (2013.01)

(58) Field of Classification Search
  USPC ........................................................ 345/690
  See application file for complete search history.

(56) References Cited

U.S. PATENT DOCUMENTS

| | | | | |
|---|---|---|---|---|
| 7,852,313 | B2* | 12/2010 | Sekiguchi | 345/102 |
| 8,009,245 | B2* | 8/2011 | Kim | G02B 6/0068 250/200 |
| 8,115,214 | B2* | 2/2012 | Son | H01L 25/0753 257/100 |
| 8,415,695 | B2* | 4/2013 | Lenk | F21V 3/00 257/98 |
| 8,459,855 | B2* | 6/2013 | Anandan et al. | 362/606 |
| 8,487,969 | B2* | 7/2013 | Lim | 345/690 |
| 8,567,973 | B2* | 10/2013 | Li et al. | 362/84 |
| 2006/0067073 | A1* | 3/2006 | Ting | H01L 25/0753 362/231 |
| 2006/0221044 | A1 | 10/2006 | Negley et al. | |
| 2008/0151527 | A1* | 6/2008 | Ueno | C09K 11/584 362/84 |
| 2008/0303410 | A1* | 12/2008 | Kaneda | H01L 33/504 313/503 |
| 2009/0153462 | A1* | 6/2009 | Kamada et al. | 345/102 |
| 2009/0160747 | A1* | 6/2009 | Morisue et al. | 345/88 |
| 2010/0020007 | A1* | 1/2010 | You et al. | 345/102 |
| 2010/0020109 | A1* | 1/2010 | Belik et al. | 345/690 |
| 2010/0188322 | A1 | 7/2010 | Furukawa | |
| 2011/0025731 | A1* | 2/2011 | Hayashi | 345/690 |
| 2011/0299008 | A1 | 12/2011 | Winkler et al. | |
| 2012/0281025 | A1* | 11/2012 | Hanamoto | 345/690 |
| 2013/0278650 | A1 | 10/2013 | Takahashi et al. | |

FOREIGN PATENT DOCUMENTS

| | | |
|---|---|---|
| JP | 2010-032626 | 2/2010 |
| JP | 2010-170044 | 8/2010 |
| WO | WO 2011/125356 | 10/2011 |

OTHER PUBLICATIONS

Extended European Search Report for corresponding EP Application No. 13161278.0-1904, Jul. 2, 2013.

* cited by examiner

DISPLAY APPARATUS WITH COLOR FILTERS AND LIGHT SOURCES AND METHOD OF CONTROLLING THE SAME

CROSS-REFERENCE TO RELATED APPLICATIONS

The present application claims priority under 35 U.S.C. §119 to Japanese Patent Application No. 2012-075357, filed Mar. 29, 2012. The contents of this application are incorporated herein by reference in their entirety.

BACKGROUND OF THE INVENTION

1. Field of the Invention

The present invention relates to a display apparatus and a method of controlling the display apparatus.

2. Description of the Related Art

There are a reflective type liquid crystal display apparatus and a transmissive type liquid crystal display apparatus in conventional liquid crystal display apparatus, and of these, in a transmissive liquid crystal display apparatus, an image is displayed by the light emitted from a planar light source (i.e. backlight) disposed at a back surface of a liquid crystal panel. For such a backlight light source, a cold cathode fluorescent lamp (CCFL) has been mainly employed. A CCFL does not employ a heater or a filament and has a small size and a relatively high luminance.

However, the color reproduction range is to some extent limited by the emission color of the fluorescent material used in the CCFL. Thus, there has been a problem that a liquid crystal display has an inferior color reproduction range in terms of the NTSC ratio compared to that of other kinds of displays such as a cathode-ray tube and a plasma display panel (PDP).

In such a liquid crystal display, in order to realize a color reproduction range which is greater than that of a cathode-ray tube or PDP, a light emitting diode (LED) is thought to be employed as a back light source as an alternative to a CCFL. For example, as a backlight light source, a white LED has been used, which employs a combination of a blue LED and a fluorescent material which is capable of being excited by the emission of the blue LED and converting the wavelength of the emission to emission of yellow to yellow green color. In order to obtain full-color visualization with the use of such a white backlight light source, color filters are used in combination with the white backlight light source.

See Japanese Unexamined Utility Model Application No. 2010-32626; and Japanese Unexamined Utility Model Application No. 2009-229974.

SUMMARY OF THE INVENTION

According to one aspect of the present invention, a display apparatus includes a first light source, a second light source, a third light source, a first color filter, a second color filter, a third color filter, and an opto-functional device. The first light source is to emit light having a first spectrum having a first peak wavelength. The second light source is to emit light having a second spectrum having a second peak wavelength longer than the first peak wavelength. The third light source is to emit light having a third spectrum having a third peak wavelength between the first peak wavelength and the second peak wavelength. The first color filter is to transmit light having a wavelength corresponding to the first spectrum. The second color filter is to transmit light having a wavelength corresponding to the second spectrum. The third color filter is to transmit light having a wavelength corresponding to the third spectrum. The opto-functional device is configured to control transmissive and intransmissive states of each of the first color filter, the second color filter, and the third color filter at each sub-pixel. The first light source and the second light source are allowed to emit light in a first emission time period to form a first display pattern. The third light source is allowed to emit light and the opto-functional device controls the third color filter to transmit light in a second emission time period to form a second display pattern. The first emission time period and the second emission time period are alternately repeated to combine the first display pattern and the second display pattern to obtain an intended display pattern when the display apparatus displays the intended display pattern.

According to another aspect of the present invention, in a method of controlling a display apparatus, a first light source and a second light source are controlled to emit light in a first emission time period to form a first display pattern. The first light source is provided to emit light having a first spectrum having a first peak wavelength. The second light source is provided to emit light having a second spectrum having a second peak wavelength longer than the first peak wavelength. A third light source is controlled to emit light and a color filter is controlled to transmit light emitted by the third light source in a second emission time period to form a second display pattern. The third light source is provided to emit light having the third spectrum having a third peak wavelength between the first peak wavelength and the second peak wavelength. The first emission time period and the second emission time period are alternately repeated to combine the first display pattern and the second display pattern to obtain an intended display pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF EMBODIMENTS

Figure 1A:
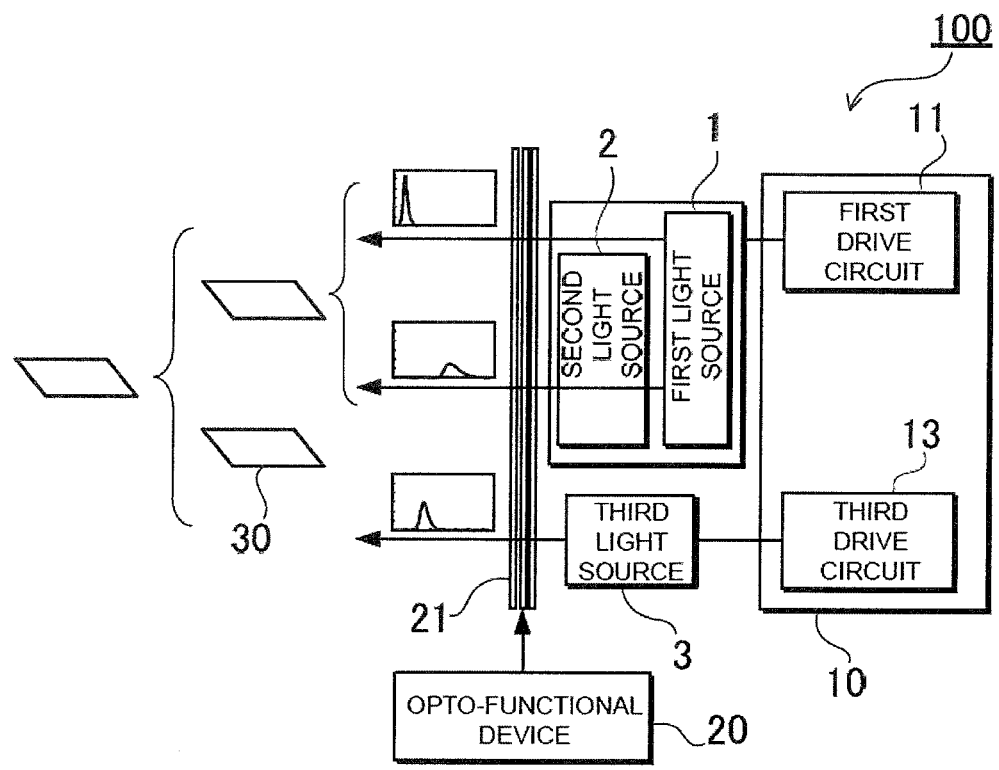
FIG. 1A is a block diagram showing a display apparatus according to Embodiment 1.

The embodiments will now be described with reference to the accompanying drawings, wherein like reference numerals designate corresponding or identical elements throughout the various drawings.

However, the examples described below are illustrations of a display apparatus and a display method using the same to give a concrete form to technical ideas of the invention, and the display apparatus and a display method using the same are not specifically limited to description below. Further, the members shown in claims attached hereto are not specifically limited to members in the examples. Particularly, the sizes, materials, shapes and the relative arrangement etc., of the members described in examples are given as an example and not as a limitation to the scope of the invention unless specifically stated. The sizes and the positional relationships of the members in each of drawings are occasionally shown exaggerated for ease of explanation. Further, in the description below, the same designations or the same reference numerals denote the same or like members and duplicative descriptions will be appropriately omitted. In each constituting component of the present invention, multiple components may be constructed using the same member so that one member can serve as multiple components, or vice versa, a function of a member may be shared by multiple members. Constitutions described in some of examples and embodiments can be employed in other examples and embodiments.

In a display apparatus according to an embodiment of the present invention, the first light source is a first semiconductor light emitting element capable of emitting light of the first spectrum, and the second light source is a wavelength converting member which is capable of being excited by light of the first spectrum emitted by the first light emitting element and converting the wavelength of light emitted by the first light emitting element and emitting light of the second spectrum.

With the structure described above, a first spectrum of light and a second spectrum of light can be simultaneously emitted from a single semiconductor light emitting element, which can facilitate synchronization of lighting timing and reduction of the number of the light emitting element, so that the light source can be simplified.

A display apparatus according to an another embodiment of the present invention allows a setting in which, a combined color of the first spectrum of light emitted from the first light source and the second spectrum of light emitted from the second light source, and a color of the third spectrum of light emitted from the third light source can be set in a relationship of complementary colors.

Further, a display apparatus according to still another embodiment of the present invention allows a setting in which, in the first emission time period, the first light source and/or the second light source is allowed to emit light and the emission of the third light source is modulated in intensity by a third or less, and in the second emission time period, the emission of the first light source and/or the second light source is modulated in intensity by a third or less, and the third light source is allowed to emit light.

This arrangement can reduce the occurrence of crosstalk due to mixing of the third spectrum of light in the first emission time period which results in reduction of color reproductivity.

Further, a display apparatus according to still another embodiment of the present invention allows a setting in which, in the first emission time period, the first light source and/or the second light source is allowed to emit light and the third light source is turned off, and in the second emission time period, the first light source and/or the second light source is turned off, and the third light source is allowed to emit light.

Further, a display apparatus according to still another embodiment of the present invention allows a setting in which, in the first emission time period, an opto-functional device controls the third color filter intransmissive and controls the transmissive and intransmissive states of the first color filter and the second color filter, and in the second emission time period, the opto-functional device controls the first color filter and the second color filters intransmissive and controls the transmissive and intransmissive states of the third color filter.

Further, a display apparatus according to still another embodiment of the present invention allows a setting in which the first peak wavelength of the first spectrum of light is in a blue light range, the second peak wavelength of the second spectrum of light is in a red light range, and the third peak wavelength of the third spectrum of light is in a green light range.

Further, in a display apparatus according to still another embodiment of the present invention, the third semiconductor light emitting element and the wavelength converting material are sealed with a light transmissive material and the light transmissive material can be provided with a green filter component.

Further, in a display apparatus according to still another embodiment of the present invention, the first light source and the third light source can be housed in a single package.

With the structure described above, the first light source and the third light source emit light at approximately a single location with approximately the same properties, so that occurrence of color unevenness can be suppressed.

Further, in a display apparatus according to still another embodiment of the present invention, the third light source can be a combination of the third light semiconductor light emitting element having a peak wavelength of 490 nm or less and a wavelength converting material capable of being excited by light from the third semiconductor light emitting element and emitting green fluorescent light.

Further, in a display apparatus according to still another embodiment of the present invention, the first light emitting element can be formed with a semiconductor light emitting element having similar properties as the third semiconductor light emitting element. With the arrangement described above, common members can be used for the first light source and the third light source and the cost and work of manufacturing can be reduced. Also, employing of the first light source and the third light source having common physical properties enables obtaining of an advantage in which the quality of emission obtained by combining the both can be stabilized.

Further, in a display apparatus according to still another embodiment of the present invention, the third light source can be the third semiconductor light emitting element capable of emitting the third spectrum of light.

Further, a display apparatus according to still another embodiment of the present invention allows a construction in which, a fourth semiconductor light emitting element having a peak wavelength of 420 nm or less is included, the first light source is a wavelength converting material capable of being excited by at least the light from the fourth semiconductor light emitting element and emitting blue fluorescent light, and the second light source is a wavelength converting material capable of being excited by at least the light from the fourth semiconductor light emitting element and emitting red fluorescent light.

Further, in a display apparatus according to still another embodiment of the present invention, in an intensity ratio between excitation light component released without absorbed by the wavelength converting material and fluorescent light component converted by the wavelength converting material, the fluorescent light component can be greater.

Further, in a display apparatus according to still another embodiment of the present invention, a fourth color filter corresponding to one of wavelength ranges of cyan, magenta, yellow, and white can be further included.

Further, a display apparatus according to still another embodiment of the present invention allows a setting in which, a fourth color filter corresponding to one of wavelength ranges of cyan, yellow, and white is further included and the fourth color filter is controlled to be in the light transmissive state in the first light emitting time period and the second light emitting time period.

Further, a display apparatus according to still another embodiment of the present invention allows a setting in which, a fourth color filter corresponding to a wavelength range of magenta, is further included and the fourth color filter is controlled to be in the light transmissive state in the first light emitting time period and in the intransmissive state in the second light emitting time period.

Embodiment 1

A display apparatus 100 according to Embodiment 1 of the present invention is shown in FIG. 1A. The display apparatus 100 shown in the figure includes a first light source 1, a second light source 2, a third light source 3, a light source drive circuit 10 for driving these light sources, color filters 21 and display portions 30. The first light source 1 emits light having a peak wavelength of first spectrum showing a first peak wavelength. The second light source 2 emits light having a peak wavelength of second spectrum showing a second peak wavelength longer than that of the first peak wavelength. Further, the third light source 3 emits light having a peak wavelength of third spectrum showing a third peak wavelength between the first peak wavelength and the second peak wavelength. In this example, while the third light source 3 is constituted of a third semiconductor light emitting element, the first light source 1 is constituted of a first semiconductor light emitting element and the second light source 2 is constituted of a wavelength converting member capable of being excited by the first semiconductor light emitting element. Accordingly, the light source drive circuit 10 includes a first drive circuit 11 for driving the first light source 1 and a third drive circuit 13 for driving the third light source 3.

A synthesized light of the first spectrum of light and the second spectrum of light, and the third spectrum of light are in a relationship of complementary colors. It is preferable to select the first spectrum of light and the second spectrum of light which are separated in the spectrum. In the example, the first spectrum of light and the third spectrum of light, and the third spectrum of light and the second spectrum of light are respectively adjacent in the spectrum.

Further, color filters 21 are disposed at a latter portion of each of the light sources. A plural colors of the color filters 21, at least three or more colors of color filters are disposed. That is, those color filters as used herein respectively have a light-transmissive state which allows light having a predetermined wavelength respectively corresponding to the first spectrum of light, the second spectrum of light, and a third spectrum of light to pass through, and a light-intransmissive state which does not allow corresponding light to pass through, which can be switched by an opto-functional device. In the present embodiment, a first color filter corresponding to the first spectrum of light, a second color filter corresponding to the second spectrum of light, and a third color filter corresponding to the third spectrum of light are provided. The light-tranmsissive/intransmissive states of the color filters are controlled by the opto-functional device 20. In the present embodiment, R, G, and B three color filters are disposed which are respectively controllable by corresponding liquid crystals.

The display portion 30 expresses a desired pattern using the first light source 1, the second light source 2, and the third light source 3 as its backlights. In the present embodiment, R, G, and B are respectively correspond to three light sources, as that, the first peak wavelength of the first spectrum of light of the first light source 1 is in a blue light range, the second peak wavelength of the second spectrum of light of the second light source 2 is in a red light range, and the third peak wavelength of the third spectrum of light of the third light source 3 is in a green light range.

The light source drive circuit 10 allows the first light source and/or the second light source to emit light in the first emission time period and the first display pattern is formed with the first spectrum of light and/or the second spectrum of light. In the second emission time period, the third light source is allowed to emit light and the second display pattern is formed with the third spectrum of light. As described above, the light source drive circuit 10 controls the emission/non-emission state of the first light source and the second light source and the emission/non-emission state of the third light source by temporal segmentation.

At this time, synchronizing the opto-functional device 20 with the controlling of the first light source, the second light source, and the third light source with the light source drive circuit 10 allows controlling of the light-transmissive/intransmissive state of the first color filter, the second color filter, and the third color filter. That is, using the light sources and the color filters in combination, the first display pattern is formed in the first emission time period and the second display pattern is formed in the second emission time period respectively, and those are synthesized in a single frame display time period. Thus, one frame of image can be displayed. In the present embodiment, the light sources and the color filters are controlled so that a red color and a blue color are expressed in the first emission time period and a green color is expressed in the second emission time period.

In the first emission time period, while the first light source and/or the second light source is allowed to emit light, the intensity of the emission of the third light is modulated to a third or less. The modulation of the intensity of light is realized by controlling the amount of light of the third semiconductor light emitting element which constituted the third light source or by controlling the third color filter to be intransmissive to light. The third semiconductor light emitting element may be turned off. This arrangement can reduce the occurrence of crosstalk due to mixing of the third spectrum of light in the first emission time period which results in reduction of color reproductivity. In a similar manner, in the second emission time period in contrast, the intensity of the first emission light source and/or the second light source is modulated to ⅓ or less or turned off, and thus occurrence of crosstalk when the third light source due to the first spectrum of light and/or the second spectrum of light at the time when the third light source emits light can be reduced or avoided.

EXAMPLE 1

Figure 1B:
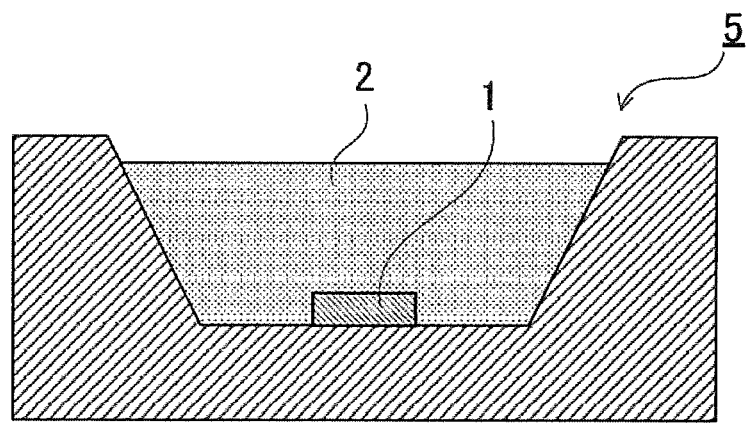
FIG. 1B is an enlarged cross-sectional view showing a light emitting element in FIG. 1A.

In Example 1, as shown in FIG. 1B, a blue LED is used as the first light source 1 and a red fluorescent material is used as the second light source 2. In the present example, a pink light emitting element 5 has a blue LED chip and a red fluorescent material arranged around the blue LED chip are respectively used as the first light source 1 and the second light source 2. The third light source 3 is a third semiconductor light emitting element capable of emitting at least a green light. Those two LEDs can be respectively turned on/off by the light source drive circuit 10.

In the present specification, a "red color" means light having a wavelength in a range of 570 nm to 800 nm, a "blue color" means light having a wavelength in a range of 420 nm to 490 nm, and a "green color" means light having a wavelength in a range of 490 nm to 570 nm.
(Timing Chart)

Figure 2:
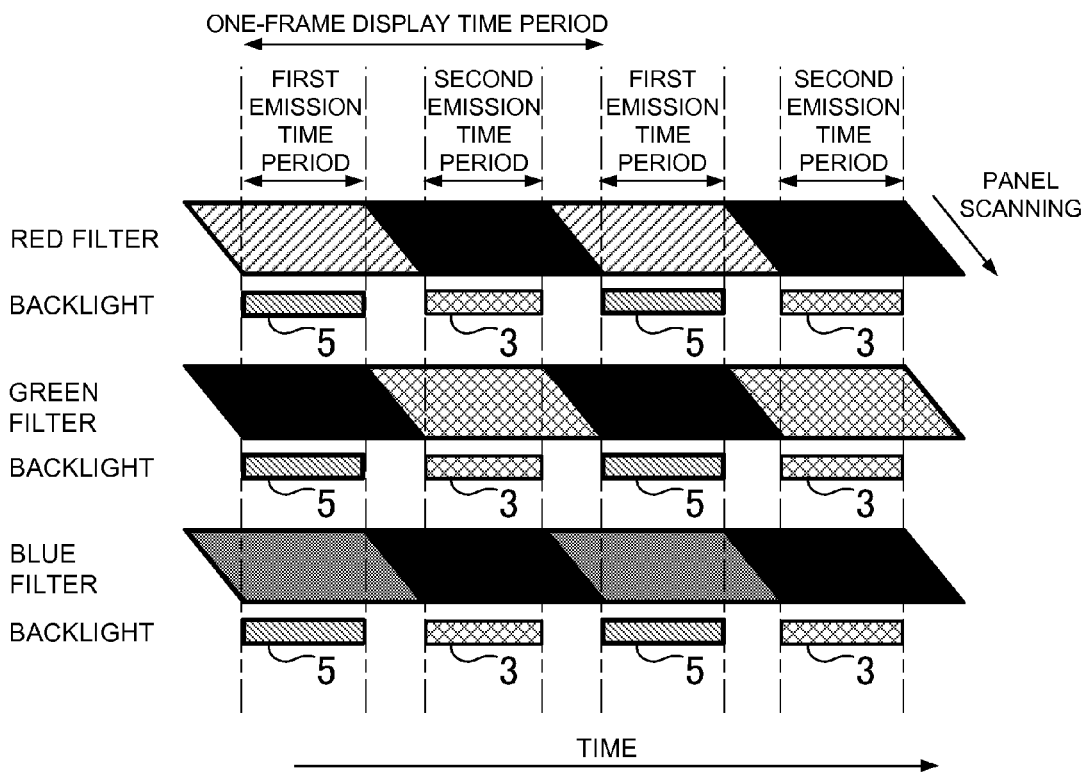
FIG. 2 is a timing chart illustrating driving timings of a display apparatus according to Example 1.

FIG. 2 shows a timing chart of controlling the display portion 30 and the backlights according to Example 1. As shown in the chart, in the first emission time period, a pink LED (light emitting element 5 of the first light source 1 and the second light source 2) is allowed to emit light and the liquid crystals are controlled so that the backlight enters the R and B color filters and at the same time the backlight does not enter the G color filter.

In the second emission time period, a green LED which is the third light source 3 is allowed to emit light and the liquid crystal is controlled so that the backlight enters the G color filter.

The first emission time period and the second emission time period are combined to form one frame display period and by repeating this, images are displayed. That is, each color component of an image of one frame to be displayed is divided into two sub-frames of a first emission time period and a second emission time period.
(Color Filter)

Figure 12:
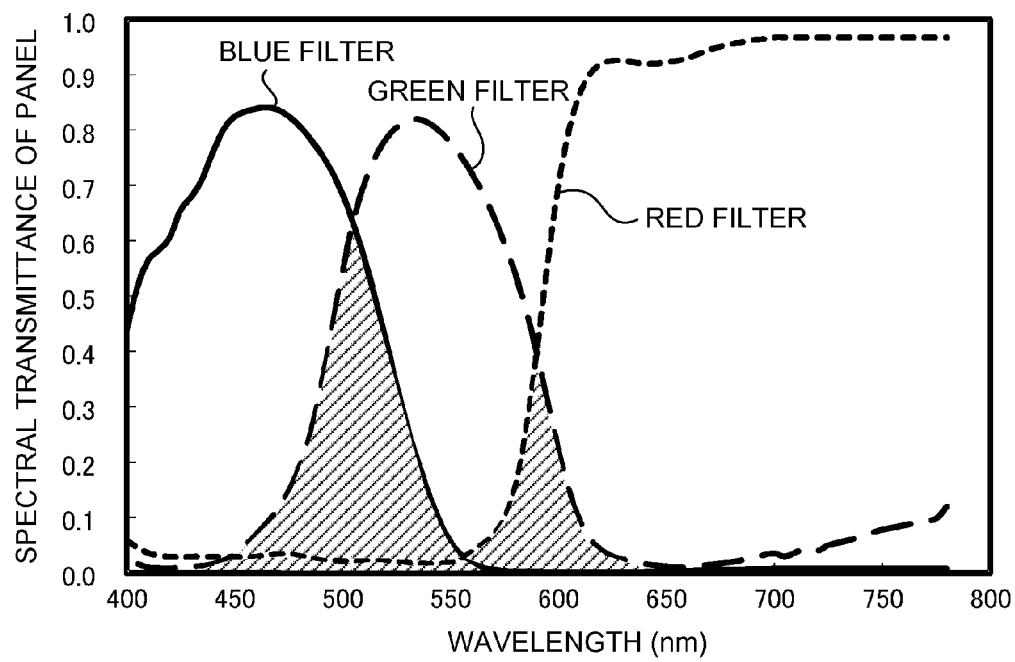
FIG. 12 is a graph showing spectral transmission spectra of color filters.

As described above, color filters of three primary colors R, G, and B are employed. Spectral transmission spectra of each color filter is shown in FIG. 12.
(Backlight)

Figure 3:
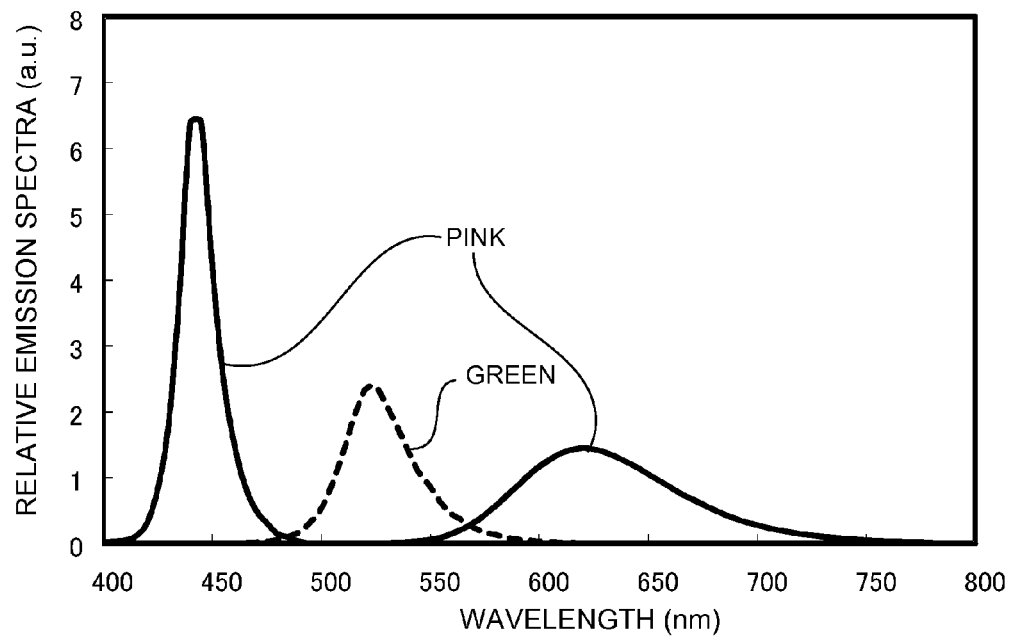
FIG. 3 is a diagram showing an emission spectrum of an LED according to Example 1.

Emission spectrum of an LED light source is shown in FIG. 3. In the present embodiment, a light emitting element 5 employing a blue LED of InGaN system blue LED for the first light source 1 and a red fluorescent material (for example, a SCASN system fluorescent material such as (Sr,Ca)AlSiN$_3$:Eu) for the second light source 2 is used. The first peak wavelength $\lambda_d$ is 448 nm and the second peak wavelength $\lambda_p$ is 620 nm. For the third light source 3, a green LED of an InGaN system is used. The third peak wavelength $\lambda_d$ is 532 nm.

Figure 4:
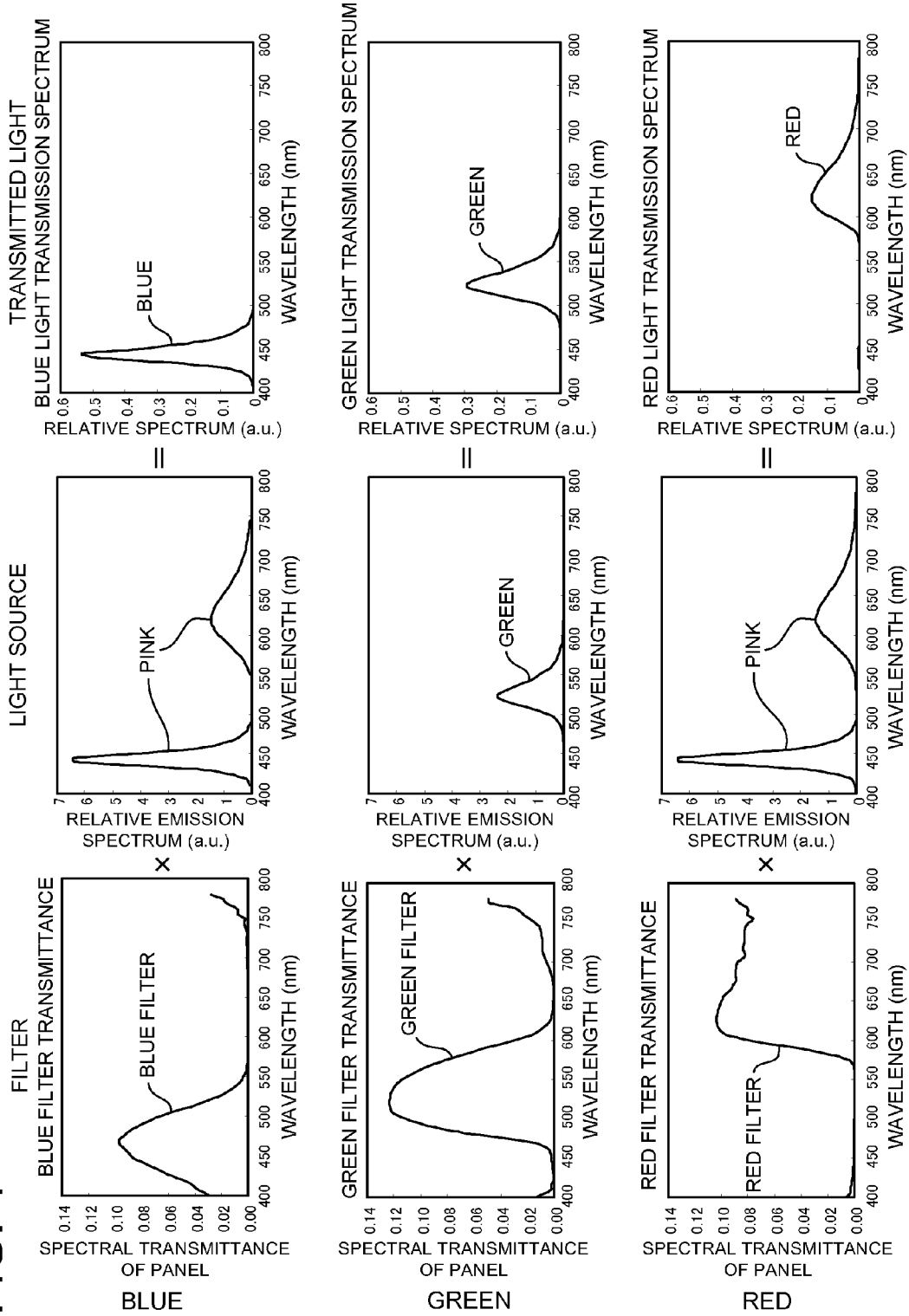
FIG. 4 shows graphs showing respective combinations of light sources, color filters, and spectra after passing through a panel, according to Example 1.
Figure 5:
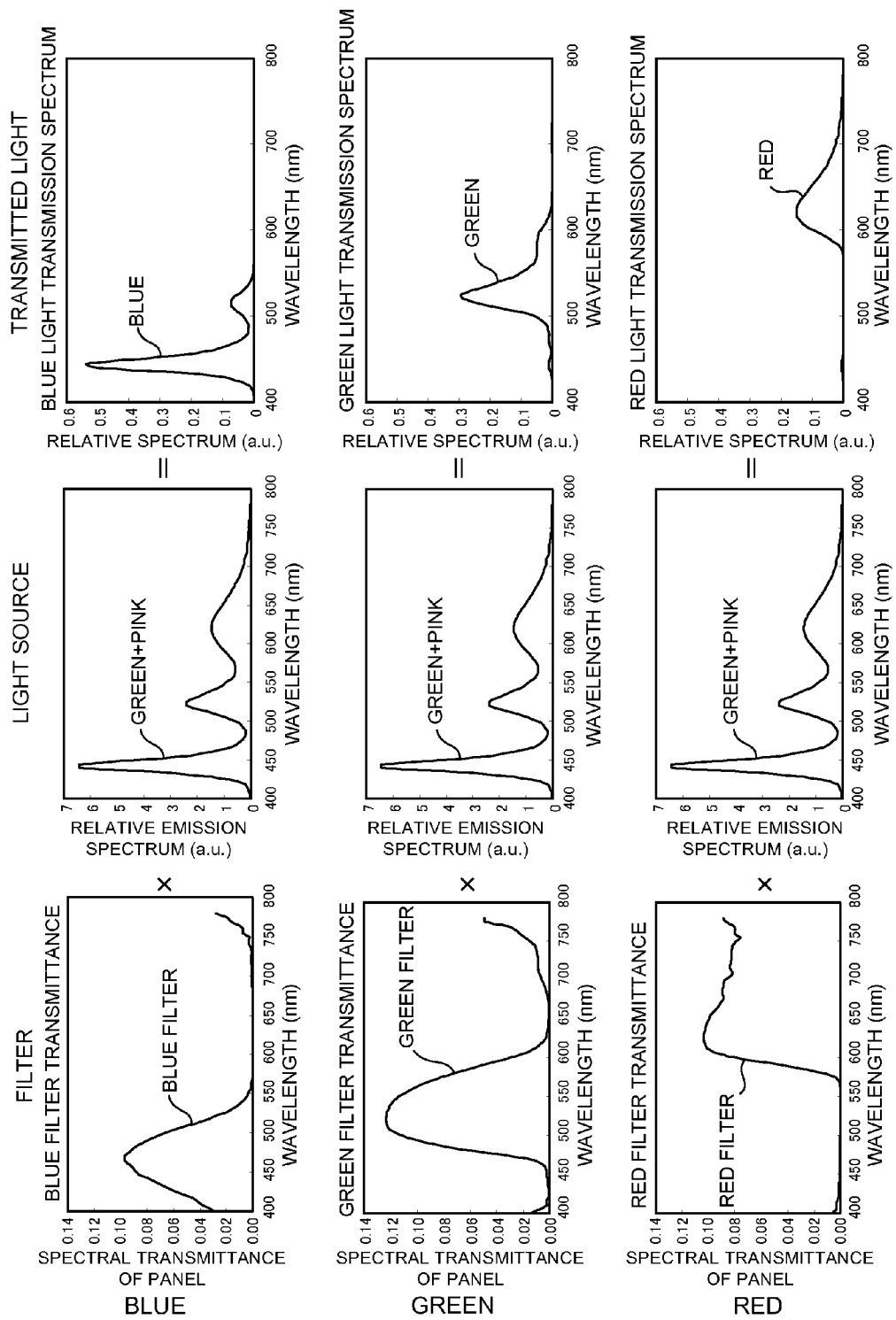
FIG. 5 shows graphs showing respective combinations of light sources, color filters, and spectra after passing through a panel, according to Comparative Example.

FIG. 4 shows graphs showing relationships of the spectra of light sources, the transmission spectra of each of the color filters and the emission spectra after passing through corresponding color filters, according to Example 1. As a comparative example, FIG. 5 shows the spectra of light through the filters of each color lights after passing through each of the color filters, at simultaneous emission and not at temporally segmented emission.

Figure 6:
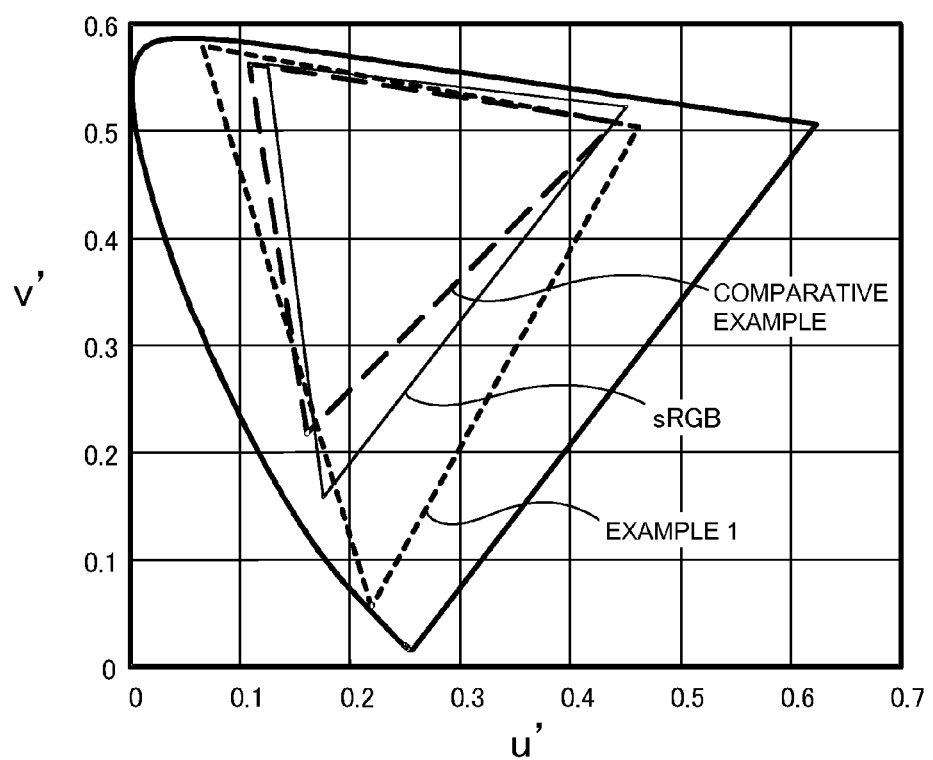
FIG. 6 is a chromaticity coordinate diagram showing chromaticities according to Example 1 and Comparative Example.

The chromaticities obtained in Example 1 and Comparative Example are compiled in Table 1 and FIG. 6. As clearly shown in above, employing a driving method described in Example 1, the color gamut can be greatly expanded from 86% to 151% in the sRGB color area.

TABLE 1

| Item | G, P Simultaneous drive | | G, P Individual drive | |
|---|---|---|---|---|
| | u' | v' | u' | v' |
| Through a blue filter | 0.161 | 0.218 | 0.219 | 0.056 |
| Through a green filter | 0.108 | 0.563 | 0.066 | 0.580 |
| Through a red filter | 0.441 | 0.508 | 0.462 | 0.504 |
| sRGB area ratio | 86% | | 151% | |

The description above illustrates a case where the three primary colors are fully displayed, but in an ordinal display, displays in neutral colors and monochrome are commonplace practice, and in such cases, the optical propagation time in the display portion is controlled. Therefore, at the time of emitting a pink light which is a first light source, the light is not necessarily passed through the R and B filters.
(Light Emitting Element)

The light emitting element 5 constituting the first light source 1 and the second light source 2 is constituted by an InGaN-based blue LED and a wavelength converting member capable of being excited by the blue light emitted from the blue LED and emitting red light, and a light transmissive member surrounding the wavelength converting member.

The InGaN based LED is an element of face-down type having patterned electrodes on its back surface. This element is mounted and bonded to the wiring disposed on the substrate through a conductive bonding member (in a flip-chip manner).

The third light source 3 is constituted by an InGaN based green LED and a light transmissive surrounding the green LED. In order to coincide the light distributing property with the first light source 1, the third light source 3 may be added with a filler for dispersing light.

The InGaN based light emitting element has a semiconductor layer stacked on a sapphire substrate. The semiconductor layer includes an n-type semiconductor layer, an active layer, and a p-type semiconductor layer stacked in this order. An n-type electrode is disposed on the n-type semiconductor layer and a p-type electrode is disposed on the p-type semiconductor layer. In the case where the element is mounted in a face-down manner, the electrodes respectively disposed on the semiconductor layers are coupled on the corresponding wirings on the substrate. The method of mounting the light emitting element employs a mounting using a solder paste as an electrically conductive bonding member or a mounting using a bump which uses gold or the like.

For the light emitting element, a light emitting diode is preferably used, and of an appropriate wavelength can be selected. For example, for the light emitting element of blue color (light of wavelength range 420 nm to 490 nm) or green color (light of wavelength range 490 nm to 570 nm), ZnSe, a nitride-based semiconductor (In$_X$Al$_Y$Ga$_{1-X-Y}$N, 0≤X, 0≤Y, X+Y≤1), GaP or the like, can be used.

In the case where a fluorescent material is employed, a nitride semiconductor (In$_X$Al$_Y$Ga$_{1-X-Y}$N, 0≤X, 0≤Y, X+Y≤1)

capable of emitting light of a short wavelength that can efficiently excite the fluorescent material is suitably used. The emission wavelength of the light emitting element can be variously selected by adjusting the materials and their mixed crystal of the semiconductor layer. The structure of the light emitting element may be selected from a structure having the both electrodes on one side of the semiconductor layer or a structure having the electrodes in an up-and down direction, on the upper surface and on the lower surface of the semiconductor layer. A semiconductor light emitting element made of a material other than the above may also be employed. The composition, emission color, size, number, or the like, of the light emitting element can be selected appropriately according to the purpose.

A light emitting element capable of emitting ultraviolet light or infrared light can also be employed as well as a light emitting element capable of emitting visible light.

(Light Transmissive Member)

The light transmissive member is provided to protect a light emitting element, a wire, a fluorescent material, a filler, and the like from dust, moisture, external force and the like.

The material of the light transmissive member preferably has transparent property capable of transmitting light from the light emitting element. Examples of such material include silicone resin, epoxy resin, and urea resin. In addition to these materials, coloring agent, light diffusing agent, light reflecting material, filler, fluorescent material or the like may also be contained as needed. In the case where the light transmissive member functions as a lens, the surface of the light transmissive member may be formed with a protrusion to form a shell shape, a convex lens shape, or the like.

(Bonding Member)

The bonding member serves to electrically connect an electrode of a light emitting element with a wiring member, in the case where a light emitting element is a FD element, and also serves to bond the light emitting element to a substrate. For the bonding member, a conductive member is used. Examples of the material include an alloy containing Au, an alloy containing Ag, an alloy containing Pd, an alloy containing In, an alloy containing Pb—Pd, an alloy containing Au—Ga, an alloy containing Au—Sn, an alloy containing Sn, an alloy containing SnAgCu, an alloy containing Sn—Cu, an alloy containing Au—Ge, an alloy containing Au—Si, an alloy containing Al, an alloy containing Cu—In, and a mixture of a metal and a flux.

(Wavelength Converting Material)

The light transmissive member may include a fluorescent member as the wavelength converting material that absorbs at least a part of light emitted from the light emitting element and emits light of different wavelength.

A fluorescent member capable of converting light from a light emitting element into light of a longer wavelength has a higher efficiency. The fluorescent member may be formed of a single layer of one kind of fluorescent material etc., or a single layer of a mixture of two or more kinds of fluorescent materials etc. Or, a stacked layer of two or more single layers containing one kind of fluorescent material, or a stacked layer of two or more single layers each containing a mixture of two or more kinds of fluorescent materials etc., can be employed.

It is sufficient that the fluorescent member is capable of absorbing light from the semiconductor light emitting element which has a nitride-based semiconductor as its semiconductor layer and emitting light of different wavelength. For example, fluorescent materials such as a β-sialon-based fluorescent material, a chrolosilicate fluorescent material, and a CASN-based fluorescent material and a SCASN-based fluorescent material which contain $AlSiN_3$:Eu can be preferably used.

EXAMPLE 2

Figure 7A:
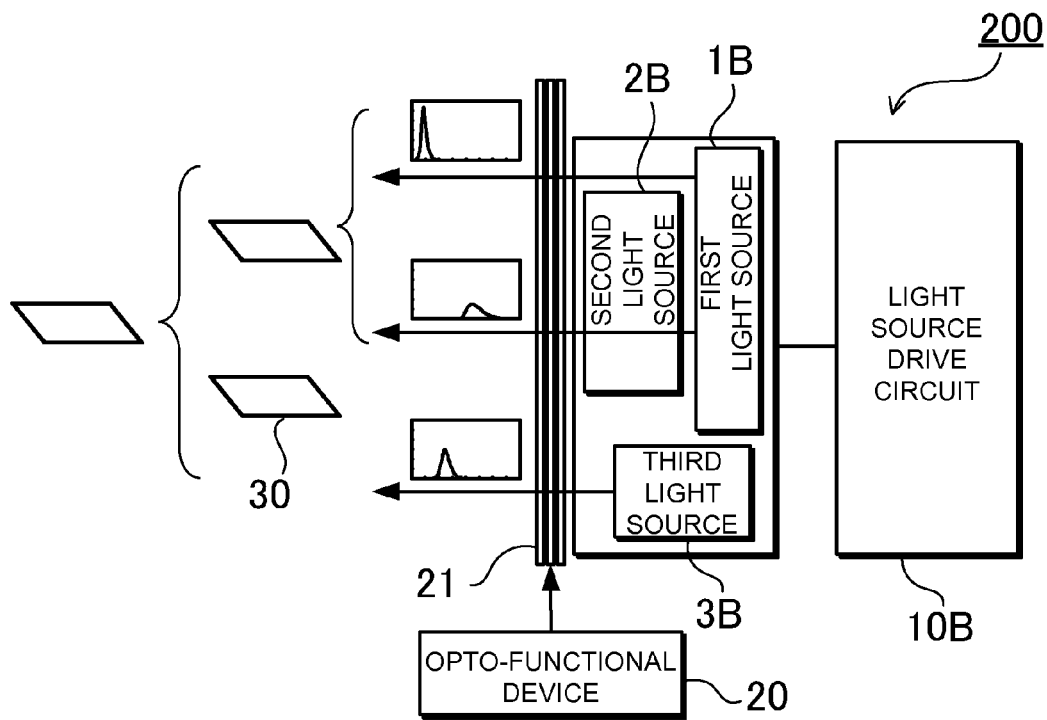
FIG. 7A is a block diagram showing a display apparatus according to Example 2.
Figure 7B:
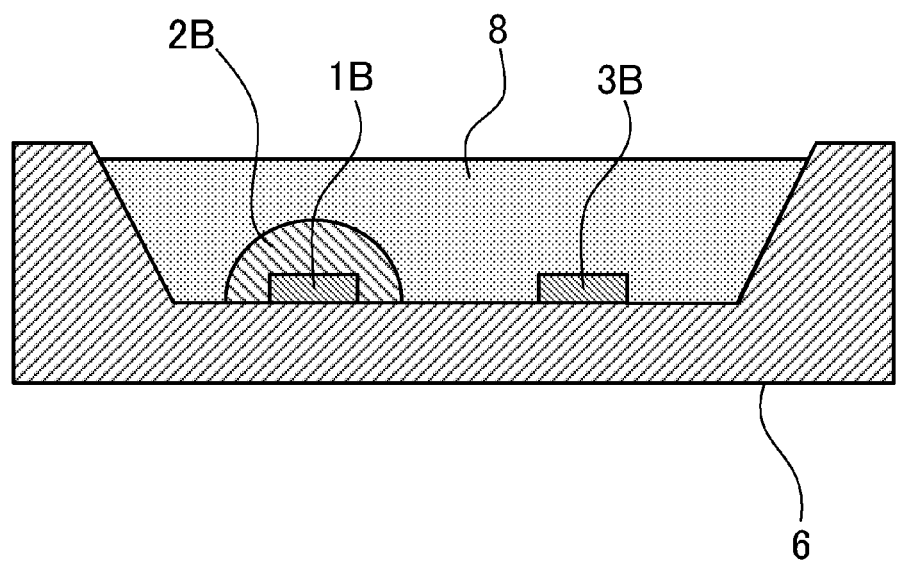
FIG. 7B is an enlarged cross-sectional view showing a light emitting element in FIG. 7A.

Next, a display apparatus 200 according to Example 2 is shown in FIG. 7A. In the display apparatus 200 shown in this figure employs, as shown in the enlarged cross-sectional view in FIG. 7B, a light emitting element 6 in which a first light source 1B and a third light source 3B are mounted in a single mold. That is, a blue LED and a green LED are disposed adjacent to each other, and a wavelength converting material capable of being excited by a blue light emitted by the blue LED and emitting a red light is disposed around the blue LED as a second light source 2B, and a light transmissive member 8 is disposed surrounding the green LED and the wavelength converting material. The blue LED and the green LED can be individually driven by the light source drive circuit 10B.

With this construction, a pink light and a green light can be emitted from approximately a single location with approximately equivalent light distribution characteristics, so that occurrence of color unevenness can be suppressed.

EXAMPLE 3

The third light source may be a combination of the third light semiconductor light emitting element having a peak wavelength of 490 nm or less and a wavelength converting material capable of being excited by light from the third semiconductor light emitting element and emitting green fluorescent light. Preferably, in an intensity ratio between excitation light component released without absorbed by the wavelength converting material and fluorescent light component converted by the wavelength converting material, the fluorescent light component is greater. In Example 3, such an example will be illustrated, and a light emitting element employing a blue LED and a wavelength converting member for the third light source will be described below. This construction includes a display portion 30, a backlight and a control circuit for those. The display portion 30 has color filters of at least R, G, and B, which are individually controlled by corresponding liquid crystal to modulate respective colors of light. The backlight includes, a first light source of a blue LED, a second light source of a light emitting element which is a combination with a red fluorescent material and is capable of emitting pink light, and a third light source which is a combination of a blue LED and a green fluorescent material and is capable of emitting blue-green light. In the third light source of the third semiconductor light emitting element, the blue LED and the green fluorescent material are molded with a light transmissive material and a green filter component is added to the light transmissive material. Also, each of the light emitting elements can be individually turned on or off.

The timing of coordinating the display portion 30 and coordinating the backlight in Example 3 is basically similar to that in Example 1, except that, a blue green light emitting portion is used instead of the green light emitting portion shown in FIG. 2 in Example 1.

Figure 8A:
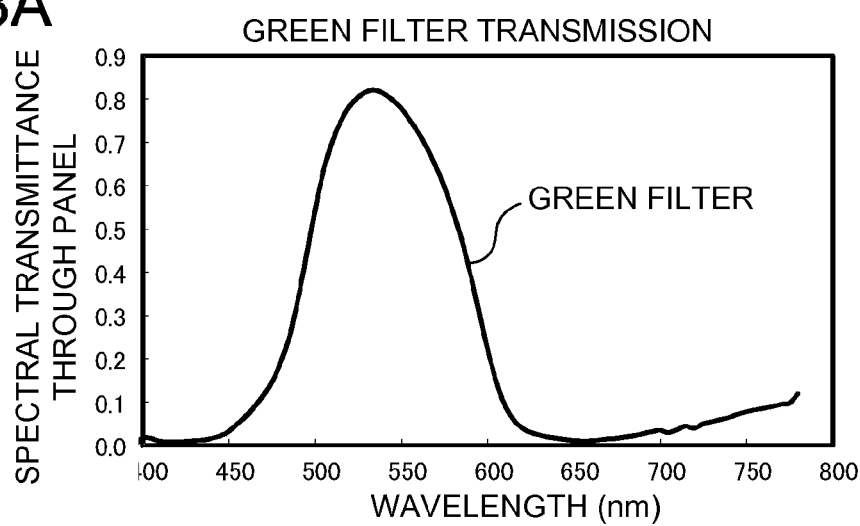
FIGS. 8A to 8C are graphs showing a blue-green light source, a green color filter, and a spectrum after passing through a panel, according to Example 3.
Figure 8B:
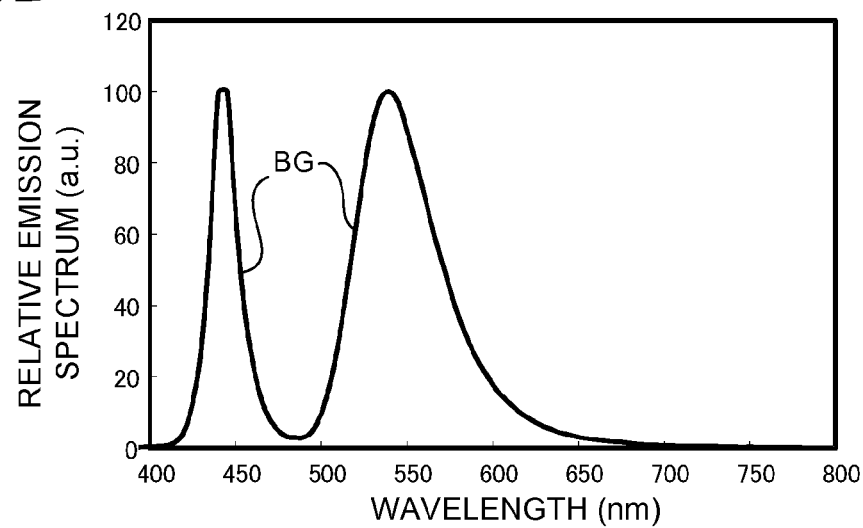
Figure 8C:
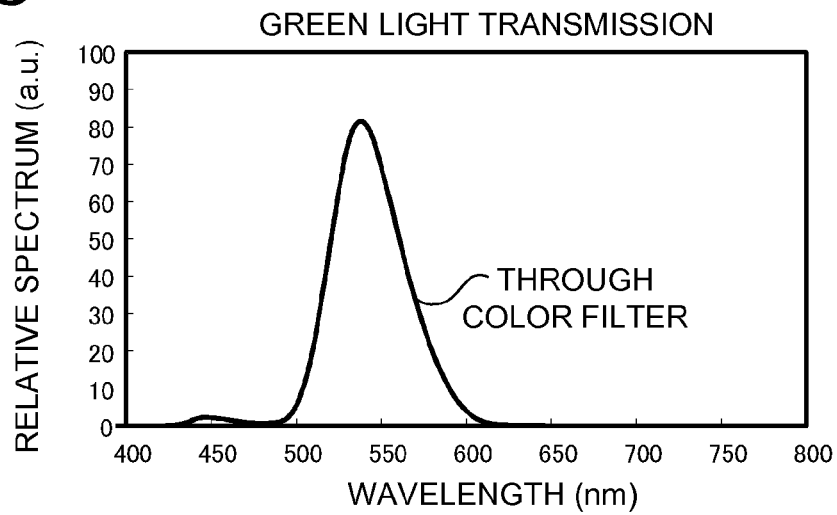

The relationship between the transmission spectrum of the green color filter, the light source spectrum of the blue-green light emitting LED, and the emission spectrum through the green filter used in Example 3 is shown in FIGS. 8A to 8C. FIG. 8A shows the transmission spectrum of the green color filter, FIG. 8B shows the light source spectrum of the blue-green light emitting LED, and FIG. 8C shows the emission spectrum through the green filter. As will be understood in conjunction with the figures, even if a blue-green LED is used, light transmitted through the green filter has a green color. In InGaN-based LEDs, green LEDs have realized an efficiency which is only about a half of that of blur LEDs. Also, such green LEDs have a high mixed crystal ratio of In, so that a large variation in the wavelength occurs. In order to improve this, a blue LED which has a high light emitting efficiency and a green fluorescent material are used, and with which a green emission having equivalent or greater quality can be obtained, and further, the variation in the wavelength in green region can be reduced. Also, as in the first light source, a fluorescent material is disposed around the LED, so that the light distribution characteristics can also be conformed to that of the first light source.

In this case, the semiconductor light emitting element used for the first light source and the third semiconductor light emitting element used for the third light source can employ semiconductor light emitting elements with similar characteristics. This arrangement has advantages that, the first light source and the third light source can share the common members, so that reduction in the production cost and time can be achieved. Further, by conforming the physical properties of the first light source and the third light source, the quality of emission obtained by combining the emission form those can be stabilized.

EXAMPLE 4

Figure 9:
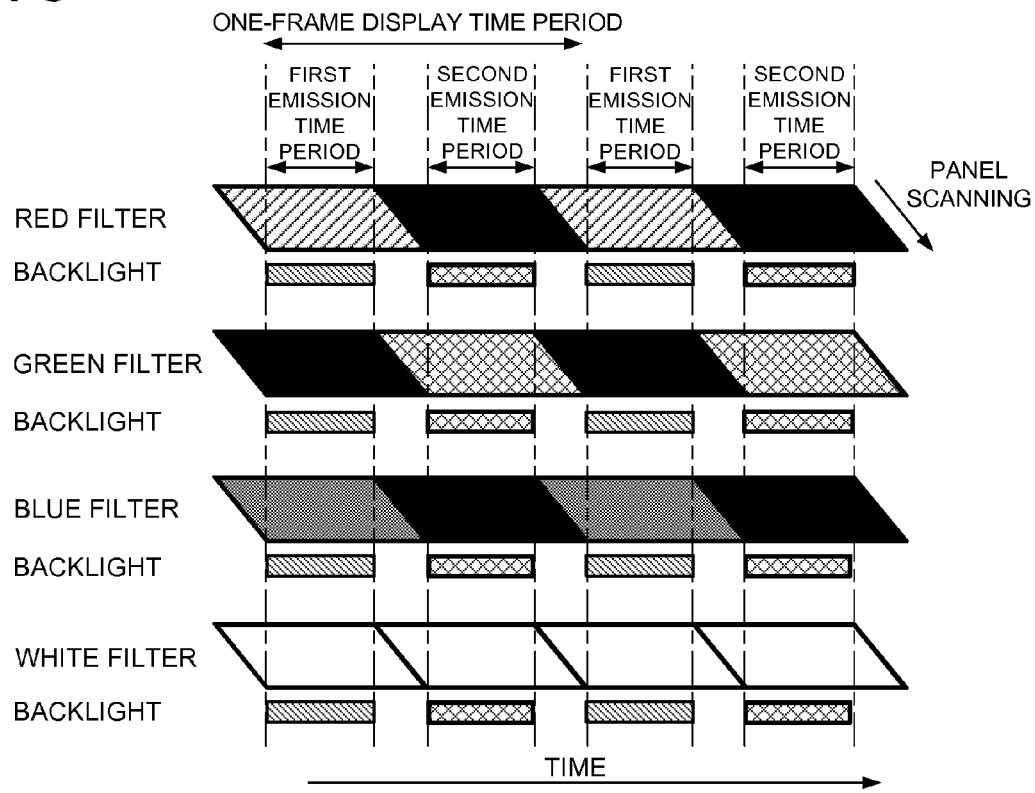
FIG. 9 is a timing chart showing driving timings according to Example 4.

Next, as Example 4, a light emitting element having a fourth color filter of a white color filter in addition to the three primary colors R, G, and B will be described. In this Example, the construction includes a display portion, a backlight, and a control circuit for those. The display portion has color filters of R, G, B and W, which are individually controlled by corresponding liquid crystal to modulate respective colors of light. The backlight includes a first light source of a blue LED, a second light source of a light emitting element which is a combination with a red fluorescent material and is capable of emitting pink light, and a third light source of a green LED. Each of the light emitting elements can be individually turned on or off. FIG. 9 shows a timing chart for controlling the display portion and the backlights according to Example 4.

In Example 4, a W color filter is added, allowing light transmitting through the W color filter in the first light emitting time period and the second light emitting time period, and thus, particularly at the time of displaying a white image, the brightness of the panel can be increased.

The example shown above described a case where a white filter is used for the fourth color filter, but not to be limited to white color, other colors such as cyan, magenta, or yellow can also be used.

EXAMPLE 5

Figure 10:
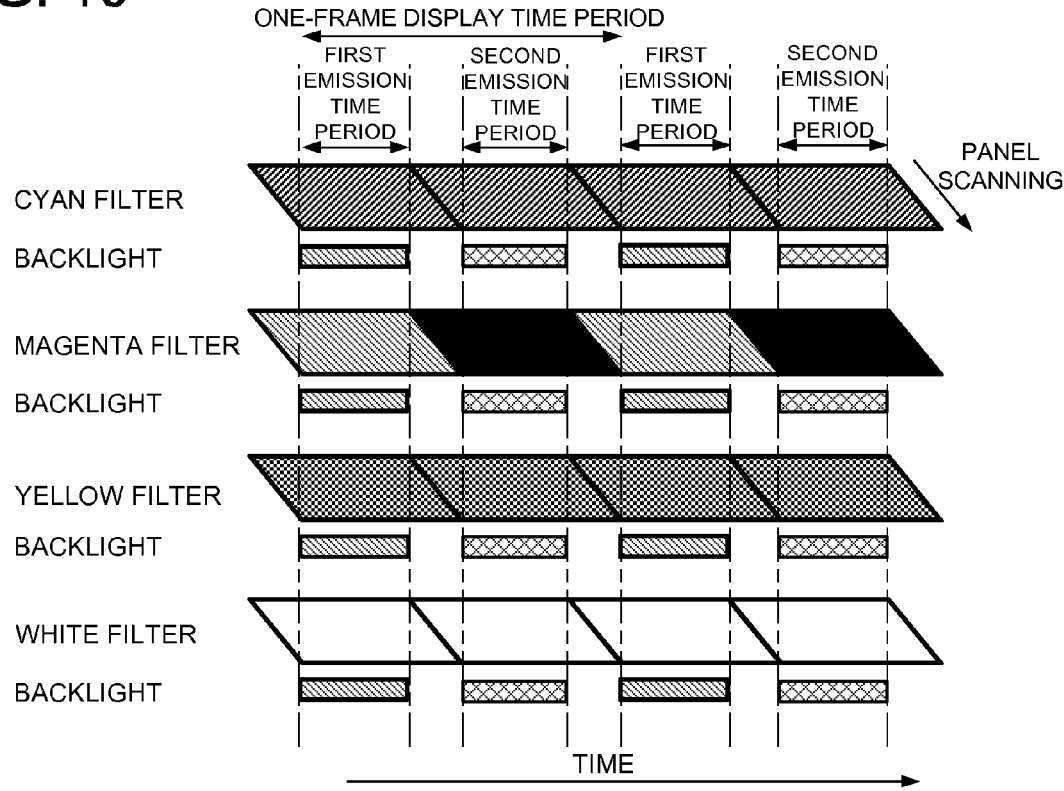
FIG. 10 is a timing chart showing driving timings according to Example 5.

Here, as Example 5, a timing chart for controlling the display and the backlights with the use of the fourth color filter is shown in FIG. 10. Here, driving timing of each display apparatus using a fourth color filter of cyan, magenta, yellow or white is shown in the figure. In this case, the driving timing of the fourth color filter is different from the driving timing of the R, G, and B color filters described above. In the first light emitting time period, the fourth color filter is in a transparent state to display a red color and a blue color. Also, in the second light emitting time period, other than magenta, the fourth color filter is in the transparent state to display a green color. On the other hand, in the case where magenta is used for the fourth color filter, the second light emitting time period is in the non-transparent state.

Embodiment 2

Figure 11:
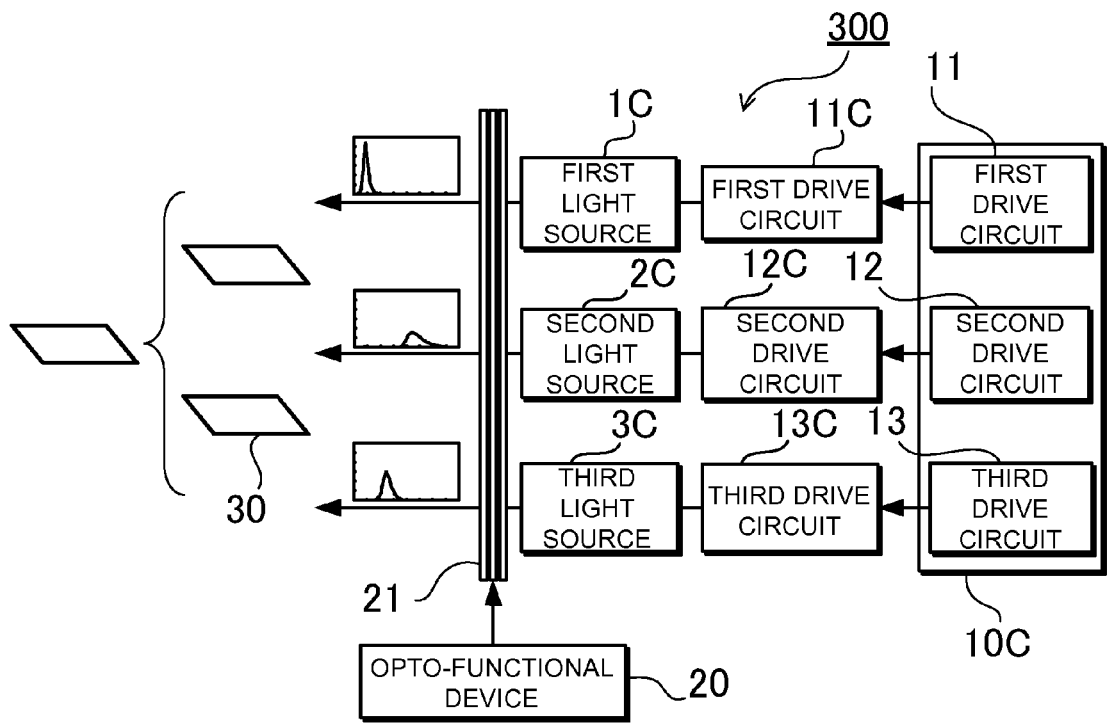
FIG. 11 is a block diagram showing a display apparatus according to Embodiment 2.

The Embodiment 1 above describes examples in which the first light source and the third light source are respectively made with a semiconductor light emitting element, and the second light source is made with a wavelength converting member capable of being excited by the first light source. The present invention is not limited to the construction described above, each light sources can be made with a semiconductor light emitting element. As Embodiment 2, such an example is shown in FIG. 11. The display apparatus 300 shown in the figure includes a first light source 1C, a second light source 2C, a third light source 3C, a light source drive circuit 100 for driving these light sources and display portions 30. In this case, the first light source 1C is a first semiconductor light emitting element capable of emitting a first spectrum of light, the second light source 2C is a second semiconductor light emitting element capable of emitting a second spectrum of light, and the third light source 3C is a third semiconductor light emitting element capable of emitting a third spectrum of light. The light source drive circuit 100 includes a first drive circuit 11C for driving the first light source 1C, a second drive circuit 12C for driving the second light source 2C, and a third drive circuit 13C for driving the third light source 3C. The light source drive circuit 100 is capable of individually controlling on and off of each of the light sources.

In this example, with respectively corresponding the first spectrum to a blue light, the second spectrum to a red light, and the third spectrum to a green light, full-color display can be obtained by color mixing of the light emitted by the first light source 1C, the second light source 2C, and the third light source 3C.

Embodiment 3

Further, although in the above, examples utilizing a semiconductor light emitting element as the first light source have illustrated, the present invention is not limited to this, and a wavelength converting member such as a fluorescent material may be used or the first light source. For example, a fourth semiconductor light emitting element may be provided to light emitting element so that the first light source is a wavelength converting member capable of being excited by the fourth semiconductor light emitting element. For example, the peak wavelength of the fourth semiconductor light emitting element is 420 nm or less, and the first light source is a wavelength converting member capable of being excited by the light emitted by the fourth semiconductor light emitting element and emitting a blue light. If the second light source is also made with a wavelength converting member which is capable of being excited by the light emitted by the fourth semiconductor light emitting element and of emitting a red light, as in a similar manner in Example 1, one light emitting element can serve both the first light source and the second light source.

As described above, according to the display apparatus according to each of the examples of the present invention and the display method using the same, in a display apparatus employing color filters, chromatic purity of three primary colors can be improved without decreasing the power efficiency and the color reproduction range can be expanded.

Particularly, conventionally, there have been problems in a display apparatus employing color filters of at least R, G, and B, in which narrow transmission spectra are unable to be represented through color filters, and the color purity of each primary color is reduced, which results in a narrow color reproduction range. However, according to the present example, the color filters of primary colors and the light sources having adjacent wavelength are not used simultaneously, and occurrence of color mixing between adjacent primary colors is avoided by temporally segmenting, and expansion of color gumut can be realized.

The display apparatus and a display method using the same can be preferably used in applications such as various indicators, liquid crystal monitors, liquid crystal TV displays, displays for mobile devices, and projectors.

It is to be understood that although the present invention has been described with regard to embodiments thereof, various other embodiments and variants may occur to those skilled in the art, which are within the scope and spirit of the invention, and such other embodiments and variants are intended to be covered by the following claims.

Obviously, numerous modifications and variations of the present invention are possible in light of the above teachings. It is therefore to be understood that within the scope of the appended claims, the invention may be practiced otherwise than as specifically described herein.

What is claimed is:

1. A display apparatus comprising:
a first light source to emit blue light having a first spectrum having a first peak wavelength;
a second light source to emit red light having a second spectrum having a second peak wavelength longer than the first peak wavelength;
a third light source to emit green light having a third spectrum having a third peak wavelength between the first peak wavelength and the second peak wavelength;
a first color filter to transmit light having a wavelength corresponding to the first spectrum;
a second color filter to transmit light having a wavelength corresponding to the second spectrum;
a third color filter to transmit light having a wavelength corresponding to the third spectrum; and
wherein the first light source and the second light source are allowed to emit light in a first emission time period to form a first display pattern,
wherein the third light source is configured to emit light and the third color filter is configured to transmit light in a second emission time period to form a second display pattern,
wherein the first emission time period and the second emission time period are alternately repeated to combine the first display pattern and the second display pattern to obtain an intended display pattern when the display apparatus displays the intended display pattern,
wherein the third color filter is configured to be set to the intransmissive state, and each of the first and second color filters are configured to be set to the transmissive states, respectively, in the first emission time period,
wherein the first and second color filters are configured to be set to the intransmissive state, and the third color filter is configured to be set to the transmissive state in the second emission time period,
wherein the first light source includes a first semiconductor light emitting diode to emit light of the first spectrum,
wherein the second light source includes a first wavelength converting material configured to be excited by light of the first spectrum emitted from the first semiconductor light emitting diode and convert a wavelength of the light of the first spectrum to emit light of the second spectrum,
wherein the third light source includes a second semiconductor light emitting diode and a second wavelength converting material configured to be excited by light emitted from the second semiconductor light emitting diode to emit light of the third spectrum, the first light source and the second light source are disposed in a single package, and the first semiconductor light emitting diode and the second semiconductor light emitting diode being configured to be driven individually, and
wherein the first wavelength converting material covers the first semiconductor light emitting diode and does not cover the second semiconductor light emitting diode, and the second wavelength converting material covers the second semiconductor light emitting diode.

2. The display apparatus according to claim 1, wherein a combined color of light emitted by the first light source and light emitted by the second light source and a color of light emitted by the third light source are in a relationship of complementary colors.

3. The display apparatus according to claim 1,
wherein in the first emission time period, at least one of the first light source and the second light source is allowed to emit light and the third light source is modulated in intensity by a third or less, and
wherein in the second emission time period, at least one of the first light source and the second light source is modulated in intensity by a third or less, and the third light source is allowed to emit light.

4. The display apparatus according to claim 1,
wherein in the first emission time period, at least one of the first light source and the second light source is allowed to emit light and the third light source is turned off, and
wherein in the second emission time period, at least one of the first light source and the second light source is turned off, and the third light source is allowed to emit light.

5. The display apparatus according to claim 1, wherein the first peak wavelength of the first spectrum of light is in a blue light range, the second peak wavelength of the second spectrum of light is in a red light range, and the third peak wavelength of the third spectrum of light is in a green light range.

6. The display apparatus according to claim 1, wherein the second semiconductor light emitting element and the second wavelength converting material are enclosed with a light transmissive material, and the light transmissive material is provided with a green filter component.

7. The display apparatus according to claim 1,
wherein the second semiconductor light emitting diode has a peak wavelength of 490 nm or less and
the second wavelength converting material is configured to emit green fluorescent light.

8. The display apparatus according to claim 7, wherein the second semiconductor light emitting diode includes a filler for dispersing light.

9. The display apparatus according to claim 1, wherein the first light emitting diode comprises a semiconductor light emitting diode having a property that is the same as a corresponding property of the second semiconductor light emitting diode.

10. The display apparatus according to claim 1, further comprising a fourth color filter corresponding to one of wavelength ranges of cyan, magenta, yellow, and white.

11. The display apparatus according to claim 1, further comprising a fourth color filter corresponding to one of wavelength ranges of cyan, magenta, yellow, and white, and the fourth color filter is controlled to be in a transmissive state in the first light emitting time period and the second light emitting time period.

12. The display apparatus according to claim 1, further comprising a fourth color filter corresponding to a wavelength range of magenta,
    wherein the fourth color filter is controlled to be in the transmissive state in the first light emitting time period and to be in the intransmissive state in the second light emitting time period.

13. The display apparatus according to claim 1, further comprising a light source driving circuit that controls at least one of the first light source and the second light source to emit light in the first emission time period to form the first display pattern, and the light source driving circuit controls the third light source to emit light in the second emission time period to form the second display pattern.

14. The display apparatus according to claim 1, wherein the first wavelength converting material is disposed in a recess of the single package and in a common mold with the first semiconductor light emitting diode.

15. The display apparatus according to claim 1, wherein the first wavelength converting material entirely covers the first semiconductor light emitting diode.

16. A method of controlling a display apparatus, comprising:
    controlling a first light source and a second light source to emit light in a first emission time period to form a first display pattern, the first light source being provided to emit light having a first spectrum having a first peak wavelength, the second light source being provided to emit light having a second spectrum having a second peak wavelength longer than the first peak wavelength;
    controlling a third light source to emit light and a third color filter to transmit light emitted by the third light source in a second emission time period to form a second display pattern, the third light source being provided to emit light having the third spectrum having a third peak wavelength between the first peak wavelength and the second peak wavelength;
    controlling transmissive and intransmissive states of each of a first color filter to transmit light having a wavelength corresponding to the first spectrum, a second color filter to transmit light having a wavelength corresponding to the second spectrum, and the third color filter to transmit light having a wavelength corresponding to the third spectrum at each sub-pixel; and
    repeating the first emission time period and the second emission time period alternately to combine the first display pattern and the second display pattern to obtain an intended display pattern,
    wherein the third color filter is set to the intransmissive state, and the first and second color filters are set to the transmissive states, respectively, in the first emission time period,
    wherein the first and second color filters are set to the intransmissive state, and the third color filter is set to the transmissive state in the second emission time period,
    wherein the first light source and the third light source are each driven individually, the first light source including a first semiconductor light emitting diode and the third light source including a second semiconductor light emitting diode,
    wherein the first semiconductor light emitting diode emits light of the first spectrum, and
    wherein the second light source includes a first wavelength converting material that is excited by light of the first spectrum emitted from the first semiconductor light emitting diode and converts a wavelength of the light of the first spectrum to emit light of the second spectrum and the third light source includes a second wavelength converting material that is excited by light emitted from the second semiconductor light emitting diode to emit light of the third spectrum, the first light source and the second light source being disposed in a single package, the first wavelength converting material covering the first semiconductor light emitting diode while not covering the second semiconductor light emitting diode, the second wavelength converting material covering the second semiconductor light emitting diode.

* * * * *